(12) United States Patent
Han et al.

(10) Patent No.: US 7,868,654 B1
(45) Date of Patent: Jan. 11, 2011

(54) READING AN EXTERNAL MEMORY DEVICE TO DETERMINE ITS INTERFACE CHARACTERISTICS FOR CONFIGURING A PROGRAMMABLE LOGIC DEVICE

(75) Inventors: Wei Han, Beaverton, OR (US); Warren Juenemann, Cornelius, OR (US); Mose Wahlstrom, Aloha, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 12/465,444

(22) Filed: May 13, 2009

(51) Int. Cl.
*H03K 19/173* (2006.01)
(52) U.S. Cl. .......................... 326/38; 326/41
(58) Field of Classification Search .............. 326/37–47
See application file for complete search history.

(56) References Cited

U.S. PATENT DOCUMENTS

| | | | |
|---|---|---|---|
| 6,028,445 A * | 2/2000 | Lawman ....................... | 326/38 |
| 6,617,877 B1 * | 9/2003 | Cory et al. .................... | 326/41 |
| 7,095,247 B1 | 8/2006 | Tang et al. | |
| 7,248,597 B2 * | 7/2007 | Kim ............................ | 370/419 |
| 7,281,082 B1 | 10/2007 | Knapp | |
| 7,356,620 B2 | 4/2008 | Xia et al. | |
| 7,378,873 B1 | 5/2008 | Tang et al. | |
| 7,425,843 B1 | 9/2008 | Edwards et al. | |

OTHER PUBLICATIONS

U.S. Appl. No. 11/761,221, Tang et al.
U.S. Appl. No. 11/447,591, Spinti et al.
Macronix International Co., Ltd., MX25L3235D Datasheet, Rev. 1.1., Oct. 14, 2008, pp. 1-50.
Winbond spiflash; 4M-Bit Serial Flash Memory With Dual and Quad SPI, Mar. 26, 2009, Preliminary—Revision A, pp. 1-70.
Silicon Storage Technology, Inc., Serial Quad I/O (SQI) Flash memory SST26VF016 / SST26VF032, Apr. 2009, pp. 1-34.

* cited by examiner

*Primary Examiner*—James Cho
(74) *Attorney, Agent, or Firm*—Haynes and Boone, LLP

(57) ABSTRACT

Various techniques are provided for determining interface characteristics of external devices. In one example, a method of configuring a programmable logic device (PLD) with configuration data stored in one or more external memory devices includes reading by the PLD an interface setup command in a bitstream from an external memory device through a configuration port of the PLD while operating the configuration port in accordance with a first set of interface characteristics. The method also includes adjusting by the PLD the configuration port to operate in accordance with a second set of interface characteristics identified by the interface setup command. The method also includes reading by the PLD configuration data in the bitstream from the external memory device through the configuration port while operating the configuration port in accordance with the second set of interface characteristics. The method also includes programming a configuration memory of the PLD with the configuration data.

19 Claims, 3 Drawing Sheets

READING AN EXTERNAL MEMORY DEVICE TO DETERMINE ITS INTERFACE CHARACTERISTICS FOR CONFIGURING A PROGRAMMABLE LOGIC DEVICE

TECHNICAL FIELD

The present invention relates generally to programmable logic devices and, more particularly, to the interfacing of programmable logic devices with external devices.

BACKGROUND

Programmable logic devices (PLDs), such as field programmable gate arrays (FPGAs) or complex programmable logic devices (CPLDs), may be configured to provide various user-defined features. In certain applications, configuration data may be stored in an external non-volatile memory such as a flash memory. The configuration data may be loaded from the external non-volatile memory into the PLD and programmed into volatile configuration memory of the PLD.

External memory devices may be implemented with a variety of different interface characteristics, such as different bus speeds, different data bus widths, or other characteristics. For example, memory devices available from Macronix International Co., Ltd, can be read serially or in two or four-bit bus widths. A PLD can read data from such a device by transmitting the appropriate read command for the data width to the memory device. However, in order for a PLD to successfully communicate with different types or different brands of external memory devices, the PLD should know the particular interface characteristics of the memory device before attempting to read data from it (e.g., in what word width the data is stored in the memory device).

For example, in one approach, external configuration signals (e.g., supply voltages or signals received from another device) may be provided to one or more dedicated external configuration pins of a PLD. Logic states of the external signals received at the dedicated external pins may be used to identify the interface characteristics of the external memory device to the PLD.

Unfortunately, external PLD pins are typically very limited in supply, and developers often prefer to use external PLD pins for general-purpose user logic (e.g., as input/output (I/O) pins) rather than as dedicated memory interface configuration pins. Moreover, external PLD pins that are used to identify interface characteristics often cannot be easily reused for general-purpose user logic.

In another approach, a PLD may issue different known read commands to an external memory device and determine which of the read commands causes the external memory device to respond successfully. However, this "trial-and-error" approach is inefficient in that it requires the PLD to issue various different types of read commands with no assurance that any of the read commands will actually cause the external memory device to respond. As a result, there is a need for an improved approach for identifying external memory device interface characteristics to PLDs.

SUMMARY

In accordance with one embodiment of the present invention, a method of configuring a programmable logic device (PLD) with configuration data stored in one or more external memory devices includes reading by the PLD an interface setup command in a bitstream from an external memory device through a configuration port of the PLD while operating the configuration port in accordance with a first set of interface characteristics; adjusting by the PLD the configuration port to operate in accordance with a second set of interface characteristics identified by the interface setup command; reading by the PLD configuration data in the bitstream from the external memory device through the configuration port while operating the configuration port in accordance with the second set of interface characteristics; and programming a configuration memory of the PLD with the configuration data.

In accordance with another embodiment of the present invention, a programmable logic device (PLD) includes a configuration port; a configuration memory; and a configuration port controller adapted to: read an interface setup command in a bitstream through the configuration port while operating the configuration port in accordance with a first set of interface characteristics; and adjust the configuration port to operate in accordance with a second set of interface characteristics identified by the interface setup command.

In accordance with another embodiment of the present invention, a programmable logic device (PLD) comprising: a configuration port; and means for reading an interface setup command in a bitstream through the configuration port while operating the configuration port in accordance with a first set of interface characteristics and for adjusting the configuration port to operate in accordance with a second set of interface characteristics identified by the interface setup command.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various techniques described herein, interface characteristics associated with one or more external devices can be determined by a PLD using an interface setup command read from one or more of the external memory devices. Advantageously, the interface characteristics can be determined from the interface setup command without requiring dedicated pins of the PLD to be used to determine the interface characteristics.

In one embodiment, a PLD may be initially set up to read a bitstream from an external device (e.g., an external memory device) connected through a serial peripheral interface (SPI) port in accordance with conventional low speed single bit width data read techniques that are generally supported by SPI devices as will be understood by those skilled in the art. Upon execution of an interface setup command (e.g., a "REFRESH" command or other command with associated operands) encoded in the received bitstream, the PLD changes the operation of the SPI port to support interface characteristics identified in the interface setup command. Thereafter, the PLD reads configuration data from the external device in accordance with the new interface characteristics.

The interface setup command may identify various interface characteristics such as particular bus speeds, data bus widths (e.g., data widths of one, two, four bits, or other data bus widths), the use of one or multiple external devices, or other characteristics. Other types of interfaces (e.g., JTAG interfaces or other interfaces) are also contemplated.

Figure 1:
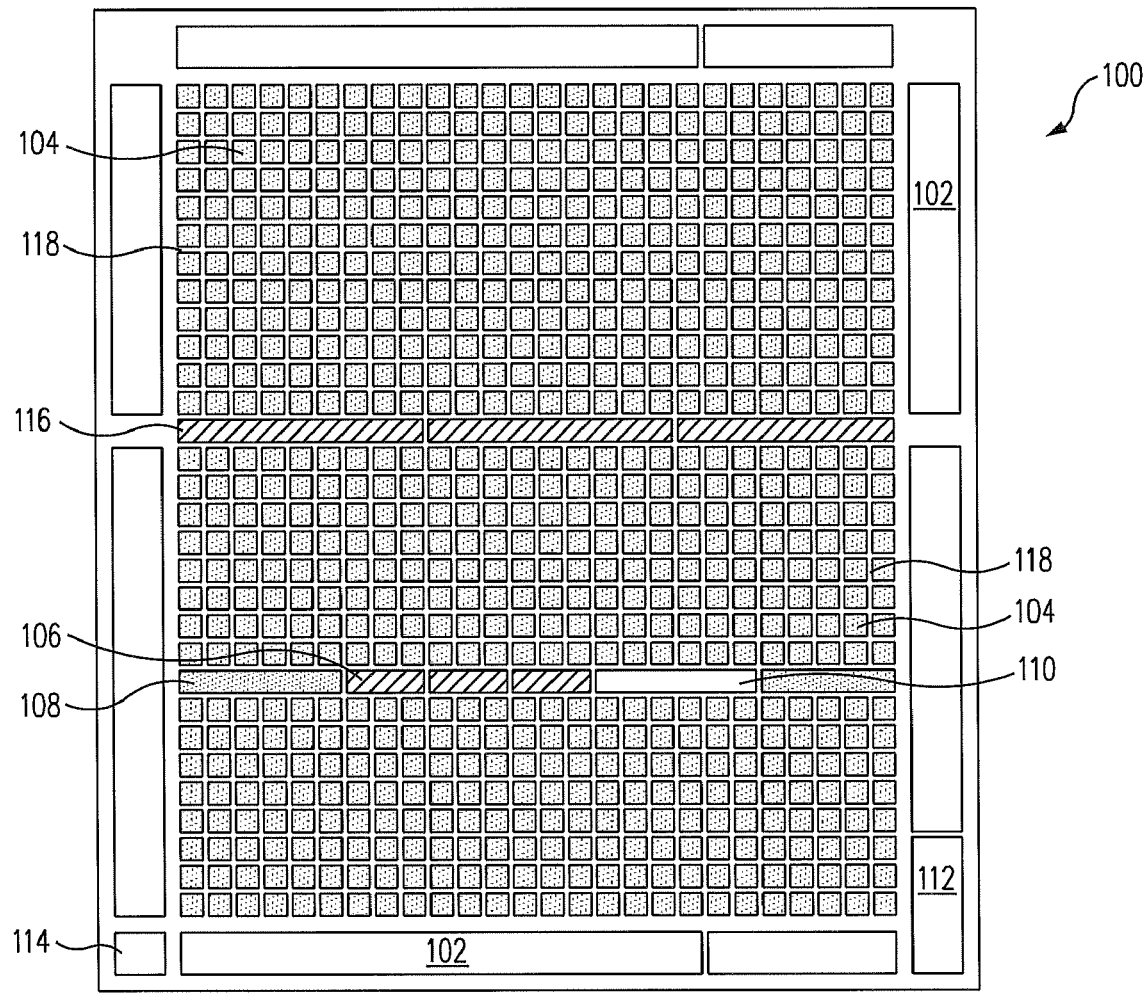
FIG. 1 illustrates a block diagram of a PLD in accordance with an embodiment of the invention.

FIG. 1 illustrates a block diagram of a programmable logic device (PLD) 100 in accordance with an embodiment of the invention. In one embodiment, PLD 100 may be implemented as a PLD in the ECP2/M family of devices available from Lattice Semiconductor Corporation of Hillsboro, Oreg.

PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

Figure 2:
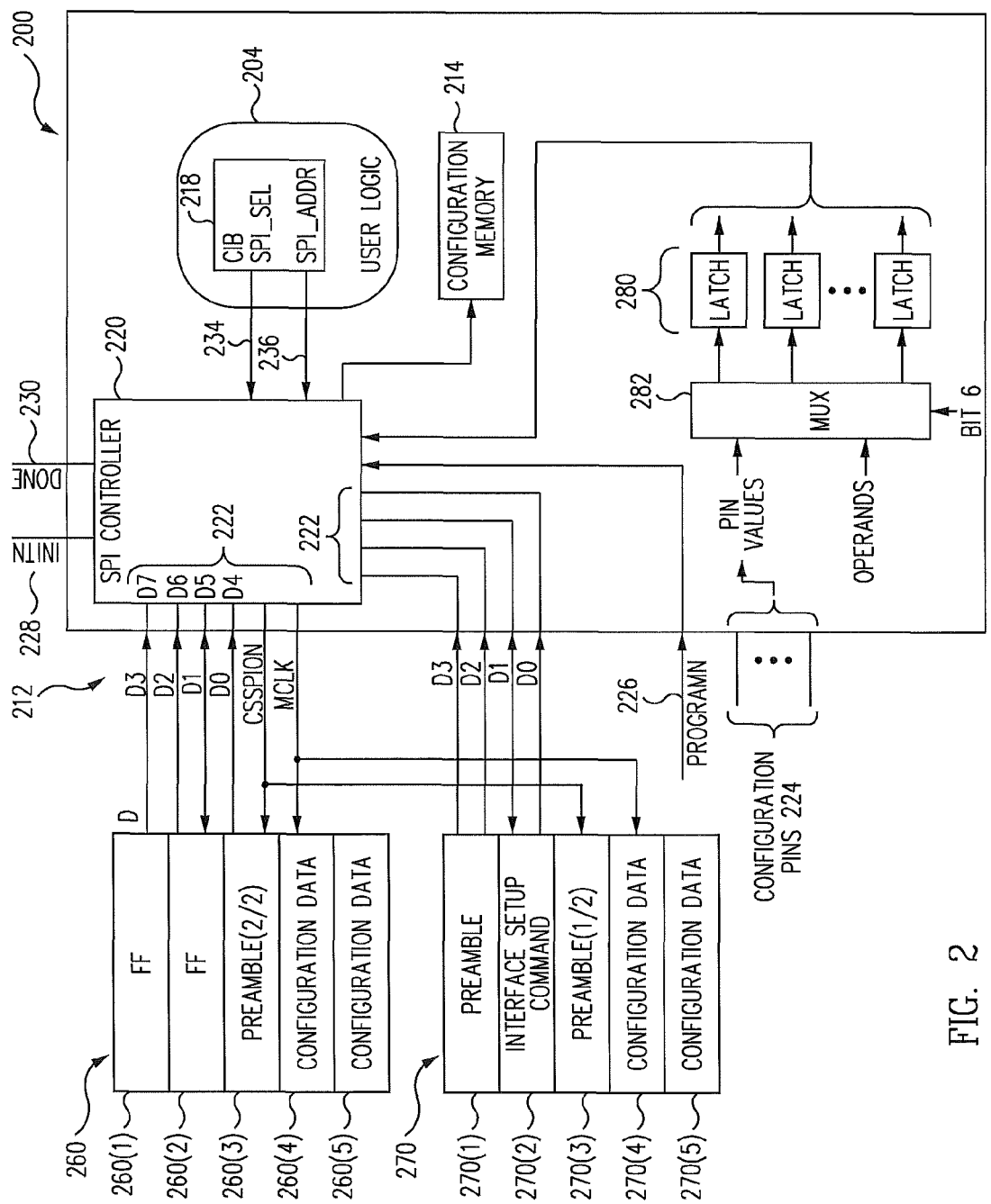
FIG. 2 illustrates a block diagram of a PLD and a plurality of external devices in accordance with an embodiment of the invention.

FIG. 2 illustrates a block diagram of a PLD 200 and a plurality of external devices in accordance with an embodiment of the invention. For example, in one embodiment PLD 200 may be implemented by PLD 100 of FIG. 1 previously described herein.

PLD 200 may include means such as SPI port 212 (e.g., implemented by configuration port 112 of PLD 100) for interfacing with one or more external devices. As understood by those skilled in the art, SPI is a serial bus standard established by Motorola Corporation and supported in silicon products from various manufacturers. In other embodiments of the invention, other serial or parallel bus interfaces may be used.

SPI port 212 is supported by a SPI controller 220 and a plurality of SPI pins 222 (labeled D0-D7, MCLK, and CSSPI0N) to facilitate interfacing PLD 200 with external SPI-compatible devices. SPI controller may provide means for reading an interface setup command in a bitstream through SPI port 212 while operating SPI port 212 in accordance with a first set of interface characteristics and for adjusting SPI port 212 to operate in accordance with a second set of interface characteristics identified by the interface setup command.

A PROGRAMN pin 226 may be used to trigger a loading of configuration data from an external non-volatile memory as further described herein. SPI controller 220 also supports an INITN pin 228 and a DONE pin 230 which may be used to indicate the configuration status of PLD 100.

PLD 200 also includes user logic 204 (e.g., implemented by logic blocks 104 of PLD 100) and a common interface block (CIB) 218 (e.g., implemented by routing resources 118 of PLD 100), all of which may be used by SPI controller 220 in the loading of configuration data from external SPI-compatible devices.

User logic 204 is user-defined logic that is determined by the particular configuration data loaded and programmed into configuration memory 214 (e.g., implemented by configuration memory 114 of PLD 100). CIB 218 facilitates the interfacing of user logic 204 with SPI controller 220 through a SPI_SEL signal 234 and a SPI_ADDR bus 236 which may be determined by user logic 104.

SPI pins 222 may interface with devices external to PLD 200 such as, for example, external memory devices 260 and 270 or other appropriate types of external devices which may communicate with PLD 200. Each of external memory devices 260 and 270 may be implemented as non-volatile memories (for example, flash memories, EEPROMs, EPROMs, PROMs, ROMs, or other types of non-volatile memories) and may include a plurality of memory blocks 260(1) to 260(5) and 270(1) to 270(5), respectively (e.g., with each memory block corresponding to groups of one or more memory addresses). Such memory devices are available from a number of sources including Macronix noted above; Silicon Storage Technology, Inc.; and Winbond Electronics Corporation America.

In one embodiment, external memory devices 260 and 270 are implemented with four-bit widths (e.g., each memory address stores four data bits), however other bit widths are also contemplated. Also, although only two external memory devices 260 and 270 are shown in FIG. 2, any desired number of external memory devices may be used (e.g., one, two, or more external memory devices).

In one embodiment, data in memory blocks 260(1) to 260(2) may be stored as four-bit data words contained entirely within external memory device 260, and data stored in memory blocks 270(1) to 270(2) may be stored as four-bit data words contained entirely within external memory device 270. Also, in such an embodiment, data in memory blocks 260(3) to 260(5) and 270(3) to 270(5) may be stored as eight-bit data words distributed between external memory devices 260 and 270 (e.g., four bits of each data word are stored by each of external memory devices 260 and 270). In other embodiments, other data storage techniques may be used as may be desired for particular applications.

In the embodiment shown in FIG. 2, the memory blocks of external memory devices 260 and 270 may be used to store various types of data including, for example, configuration data, preambles, and interface setup commands. Configuration data (e.g., stored in memory blocks 260(4), 260(5), 270(4), and 270(5)) may be loaded into PLD 200 and programmed into configuration memory 214.

Preambles (e.g., stored in memory blocks 260(3), 270(1), and 270(3)) correspond to a particular sequence of bit values (for example, a 16 bit opcode) that may be recognized by PLD 200 to identify the beginning of a data sequence that may be processed by PLD 200. For example, preambles may be provided before one or more commands that may be executed by PLD 200, or may be provided before one or more configuration data bitstreams to be loaded into PLD 200 and programmed into configuration memory 214.

Interface setup commands (e.g., stored in memory block 270(2)) are commands which identify one or more characteristics of SPI port 212. For example, in one embodiment, such interface setup commands may be implemented by a REFRESH command associated with one or more operands identifying the characteristics of SPI port 212 that are required for successfully reading configuration data from memory devices 260 or 270.

The following Table 1 identifies one embodiment of an eight-bit data structure which may be associated with a REFRESH command to provide six operands.

TABLE 1

| BIT POSITION: | 7 | 6 | 5 | 4-3 | 2 | 1-0 |
|---|---|---|---|---|---|---|
| OPERAND: | Check bit | Override enable | SQ | MSPI select | Vendor-specific device support | CFG |

Bit position 7 is a reserved bit position which may be provided to maintain compatibility with existing command data structures. For example, in one embodiment, bit position 7 may provide a one-bit operand that identifies whether the current REFRESH command will be followed by a checksum (e.g., a 32-bit checksum).

Bit position 6 provides a one-bit operand that determines whether characteristics identified in the operands of the data structure should override signals provided to various pins of PLD 200, such as external configuration pins 224 of PLD 200.

Bit position 5 provides a one-bit operand that identifies whether SPI port 212 is set up to read data distributed across one or two external memory devices, if the data is to be read in 8-bit mode, or across two or four memory devices, if the data is to stored in 16-bit mode. This bit is read in conjunction with bits 1-0. (e.g., data stored as eight-bit words with four bits of each word stored by one of external memory devices 260 and 270).

Bit positions 4-3 provide a two-bit operand that identifies a read speed to be used when reading data through SPI port 212 in one, two, or four-bit data widths. Data read serially can be read at high or low speeds. Data read in two or four-bit data widths are read at high speed.

Bit position 2 provides a one-bit operand that identifies whether SPI port 212 is set up to support communication protocols recognized by particular vendors of external memory devices 260 and 270. Such vendors may include, for example, Silicon Storage Technology, Inc. (SST) of Sunnyvale, Calif., or other vendors as will be understood by those of skill in the art.

Bit positions 1-0 provide a two-bit operand that identifies whether SPI port 212 is set up to support one of four possible interface characteristics while SPI port 212 is operating in a master mode: (1) single boot mode (e.g., PLD 200 boots using a single configuration data bitstream); (2) dual boot mode (e.g., PLD 200 boots using a configuration data bitstream selected from two possible configuration data bitstreams); (3) eight-bit mode (e.g., connected memory devices have eight-bit data bus widths); or (4) sixteen-bit mode (e.g., connected memory devices have sixteen-bit data bus widths). If the single or dual boot mode is selected, the operand in bit position 5 is ignored.

PLD 200 also includes latches 280 which may be used to selectively latch logic values associated with either: external configuration pins 224 of PLD 200; or operands of interface setup commands. In this regard, the logic values of the pins and the operands can be selectively provided to latches 280 by a switch such as, for example, a multiplexer 282 controlled by the operand in bit position 6 as shown in FIG. 2. For example, if bit position 6 indicates that pins should be overridden (e.g., to bypass signals received at the pins), then the values of one or more operands may be latched. Otherwise, the values of the pins may be latched. The logic values stored by latches 280 may be retained during bootup operations of PLD 200 and provided to SPI controller 220. As a result, changes to the interface characteristics of SPI port 212 may be retained after PLD 200 is rebooted.

Figure 3:
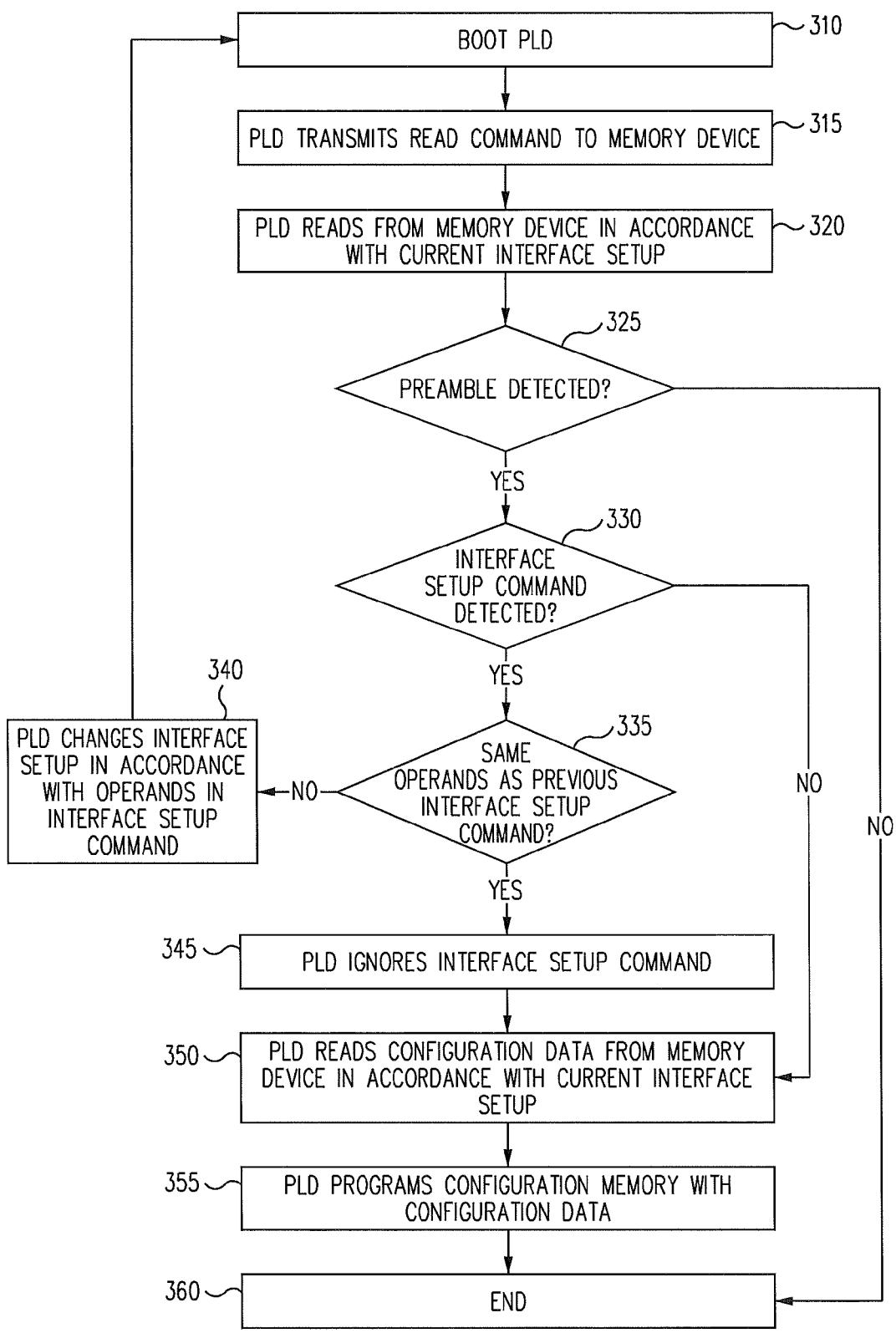
FIG. 3 illustrates a process of interfacing a PLD with one or more external devices in accordance with an embodiment of the invention.

FIG. 3 illustrates a process of interfacing PLD 200 with external memory devices 260 and 270 in accordance with an embodiment of the invention. Beginning in block 310, PLD 200 boots up, for example, in response to a powering on of PLD 200, a toggling of PROGRAMN pin 226, execution of a REFRESH instruction, or other appropriate methods.

Following the initial boot up of block 310, SPI controller 220 controls SPI port 212 in accordance with a set of default interface characteristics (e.g., as identified by the logic values stored by latches 280). For example, in one embodiment, SPI controller 220 may control SPI port 212 in a manner to support a single external memory device (e.g., external memory device 270) capable of communicating through SPI pins 222 in accordance with conventional low speed single bit width data read techniques that are generally supported by SPI devices as will be understood by those skilled in the art.

In block 315, PLD 200 transmits a read command to external memory device 270 in accordance with the default interface characteristics. In block 320, PLD 200 begins reading data from external memory device 270 in accordance with the default interface characteristics. For example, PLD 200 may begin reading data stored in memory block 270(1) of external memory device 270.

In block 325, PLD 200 determines whether a preamble has been detected in the data read from external memory device 270. For example, as shown in FIG. 2, memory block 270(1) includes a preamble. As a result, the process continues to block 330. However, if no preamble is detected, then PLD 200 will assume that external memory device 270 does not include any data which may be used by PLD 200 and the process ends (block 360).

In block 330, PLD 200 continues reading data from external memory device 270 in accordance with the default interface characteristics. For example, after reading the preamble stored in memory block 270(1), PLD 200 may begin reading data stored in memory block 270(2). Also in block 330, PLD 200 determines whether an interface setup command has been detected in the data read from external memory device 270. For example, as shown in FIG. 2, memory block 270(2) includes an interface setup command. As a result, the process continues to block 335. However, if no interface setup command is detected, then the process continues to block 350 further described herein.

In block 335, PLD 200 determines whether operands associated with the interface setup command are the same as operands of a previous interface setup command processed by PLD 200. For example, if PLD 200 has been rebooted in response to a previous interface setup command, then the values of the operands associated with the interface setup command may be stored by latches 280. Accordingly, PLD 200 may compare the operands of the current interface setup command with the values stored by latches 280. If the values are different, then the process continues to block 340. However, if the values are the same, then the current interface setup command will be ignored (block 345) and the process continues to block 350 further described herein.

In block 340, PLD 200 changes the operation of SPI controller 220 to control SPI port 212 in accordance with the interface characteristics identified by the interface setup command detected in block 330. In one embodiment, the interface setup command may be implemented as a REFRESH command with an eight-bit data structure specifying the interface characteristics in accordance with Table 1 above.

In one example, the interface setup command read from block 270(2) may include the following eight-bit data structure: 01100000. In this case, bit position 6 is set to a logic high value to pass the operand values to latches 280 for storage during rebooting. Also, bit position 5 is set to a logic high value to indicate that SPI port 212 should be controlled in a manner to support data distributed across external memory devices 260 and 270 as previously described.

Also in block 340, PLD 200 executes a refresh operation to reboot PLD 200 in response to the REFRESH command included in the interface setup command. Accordingly, the process returns to block 310 in which PLD 200 is rebooted in response to the REFRESH command. In one embodiment, PLD 200 will only execute a refresh operation in response to the REFRESH command if SPI controller 220 is currently operating SPI port 212 in a manner to support a single external memory device capable of communicating through SPI pins 222 in accordance with conventional low speed single bit width data read techniques. As a result, if PLD 200 changes the operation of SPI controller 220 to control SPI port 212 in accordance with different interface characteristics (e.g., not conventional low speed single bit width data read techniques), then PLD 200 will refrain from repeatedly rebooting in response to a re-reading of the same interface setup command.

During the rebooting of PLD 200 (e.g., during the second iteration of block 310), latches 280 retain the values of the operands associated with the REFRESH command previously executed in block 340. Accordingly, following the rebooting, SPI controller 220 remains set up to control SPI port 212 in a manner to support the reading of data distributed across external memory devices 260 and 270 as previously described in the example above.

Therefore, in the second iterations of blocks 315 and 320, PLD 200 transmits read commands to external memory devices 260 and 270 and attempts to read data distributed between external memory devices 260 and 270. In this case, SPI controller 220 will attempt to read eight-bit data words as a concatenation of data values from external memory devices 260 and 270 (e.g., reading the first four bits of each data word from external memory device 270 and reading the remaining four bits of each data word from external memory device 260). As a result, preambles, interface setup commands, or other data that are stored entirely within only one of external memory devices 260 or 270 (e.g., the dummy data stored in memory blocks 260(1) and 260(2), and the preamble and interface command stored in memory blocks 270(1) and 270(2) as previously described) will not be recognized by PLD 200 while SPI port 212 is operating in this manner. Accordingly, PLD 200 will continue reading data from external memory devices 260 and 270 until a preamble is detected (block 325) that is distributed across external memory devices 260 and 270 (e.g., the preamble stored by memory blocks 260(3) and 270(3)). After this preamble is detected, the process continues to block 330.

In block 330, PLD 200 continues reading data from external memory devices 260 and 270 in a distributed fashion. For example, after reading the preamble stored in memory blocks 260(3) and 270(3), PLD 200 may read memory blocks 260(4) and 270(4). Because memory blocks 260(4) and 270(4) contain configuration data (e.g., not an interface setup command), the process continues to blocks 350 in which PLD 200 reads the configuration data and programs configuration memory 214 to configure PLD 200 in accordance with the configuration data. PLD 200 may continue reading and programming configuration memory 214 with additional configuration data (e.g., configuration data stored in memory blocks 260(5) and 270(5)) until a complete configuration data bitstream has been programmed into configuration memory 214. As a result of the programming of configuration memory 214, PLD 200 will be configured to operate in accordance with user-defined features specified by the configuration data. Following the programming of configuration memory 214, the process ends (block 360).

Embodiments described above illustrate but do not limit the invention. It should also be understood that numerous modifications and variations are possible in accordance with the principles of the present invention. For example, the interface setup command need not be a REFRESH command that causes the PLD to reboot. Other commands such as a JUMP command may be used, so long as the command causes the PLD to transmit a new read command in accordance with the associated operands to the memory device. Accordingly, the scope of the invention is defined only by the following claims.

We claim:

1. A method of configuring a programmable logic device (PLD) with configuration data stored in one or more external memory devices, the method comprising:

reading by the PLD an interface setup command in a bitstream from an external memory device through a configuration port of the PLD while operating the configuration port in accordance with a first set of interface characteristics;

adjusting by the PLD the configuration port to operate in accordance with a second set of interface characteristics identified by the interface setup command;

rebooting the PLD in response to the interface setup command;

reading by the PLD configuration data in the bitstream from the external memory device through the configuration port while operating the configuration port in accordance with the second set of interface characteristics; and programming a configuration memory of the PLD with the configuration data.

2. The method of claim 1, wherein the first set of interface characteristics is determined by one or more signals received by one or more pins of the PLD, the method further comprising bypassing the signals while the configuration port is operated in accordance with the second set of interface characteristics.

3. The method of claim 1, wherein the first and second sets of interface characteristics identify at least one of a bus speed, a data bus width, or a number of the external devices which may be connected to the PLD through the configuration port.

4. The method of claim 1, wherein the configuration port is a serial peripheral interface (SPI) port.

5. The method of claim 1, wherein the interface setup command comprises:
a REFRESH command for the PLD; and
a data structure comprising a plurality of operands corresponding to the second set of interface characteristics.

6. The method of claim 1, wherein the interface setup command is a first interface setup command, the method further comprising:
storing the second set of interface characteristics before the rebooting;
reading a second interface setup command from the external device, wherein the second interface setup command identifies a third set of interface characteristics; and
ignoring the second interface setup command if the second set of interface characteristics corresponds to the third set of interface characteristics.

7. The method of claim 1, wherein:
the external device is a first external device;
the configuration data comprises a plurality of data words distributed between the first external device and a second external device; and
the reading configuration data comprises:
reading a first portion of the configuration data from the first external device, and
reading a second portion of the configuration data from the second external device.

8. A programmable logic device (PLD) comprising:
a configuration port;
a configuration memory; and
a configuration port controller adapted to:
read an interface setup command in a bitstream through the configuration port while operating the configuration port in accordance with a first set of interface characteristics; and
adjust the configuration port to operate in accordance with a second set of interface characteristics identified by the interface setup command.

9. The programmable logic device of claim 8, wherein the configuration port controller is further adapted to read configuration data in the bitstream through the configuration port while the configuration port is operated in accordance with the second set of interface characteristics.

10. The PLD of claim 8, wherein the first set of interface characteristics is determined by one or more signals received by one or more pins of the PLD, the PLD further comprising a switch adapted to bypass the signals while the configuration port is operated in accordance with the second set of interface characteristics.

11. The PLD of claim 10, wherein the configuration port controller is adapted to operate the pins in accordance with user logic after the configuration memory is programmed with the configuration data.

12. The PLD of claim 8, wherein the first and second sets of interface characteristics identify at least one of a bus speed, a data bus width, or a number of the external devices which may be connected to the PLD through the configuration port.

13. The PLD of claim 8, wherein the configuration port is a serial peripheral interface (SPI) port.

14. The PLD of claim 13, wherein the first set of interface characteristics correspond to data read techniques used for a single SPI device connected to the PLD through the configuration port and the second set of interface characteristics correspond to data read techniques used for a plurality of SPI devices connected to the PLD through the configuration port.

15. The PLD of claim 8, wherein the interface setup command comprises:
a REFRESH command; and
a data structure comprising a plurality of operands corresponding to the second set of interface characteristics.

16. The PLD of claim 8, wherein:
the interface setup command is a first interface setup command;
the PLD comprises a plurality of latches adapted to store the second set of interface characteristics before the rebooting; and
the configuration port controller is adapted to:
read a second interface setup command from at least the external device, wherein the second interface setup command identifies a third set of interface characteristics, and
ignore the second interface setup command if the second set of interface characteristics correspond to the third set of interface characteristics.

17. The PLD of claim 8, wherein:
the external device is a first external device;
the configuration data comprises a plurality of data words distributed between the first external device and a second external device; and
the configuration port controller is adapted to:
read a first portion of the configuration data from the first external device, and
read a second portion of the configuration data from the second external device.

18. A programmable logic device (PLD) comprising:
a configuration port; and
a configuration port controller adapted to:
read an interface setup command through the configuration port while operating the configuration port in accordance with a first set of interface characteristics; and
adjust the configuration port to operate in accordance with a second set of interface characteristics identified by the interface setup command.

19. The PLD of claim 18, wherein the configuration port controller is adapted to read the interface setup command in a serial bitstream.

* * * * *